(12) United States Patent
Janke et al.

(10) Patent No.: US 7,981,716 B2
(45) Date of Patent: Jul. 19, 2011

(54) CHIP MODULE HAVING A PROTECTION DEVICE

(75) Inventors: Marcus Janke, Munich (DE); Peter Laackmann, Munich (DE)

(73) Assignee: Infineon Technologies AG, Neubiberg (DE)

( * ) Notice: Subject to any disclaimer, the term of this patent is extended or adjusted under 35 U.S.C. 154(b) by 52 days.

(21) Appl. No.: 11/615,612

(22) Filed: Dec. 22, 2006

(65) Prior Publication Data
US 2007/0194421 A1 Aug. 23, 2007

(30) Foreign Application Priority Data
Dec. 22, 2005 (DE) .......................... 10 2005 061 553

(51) Int. Cl.
*H01L 21/00* (2006.01)
(52) U.S. Cl. .............. 438/57; 438/26; 438/73; 438/110; 257/E21.499; 257/E21.503
(58) Field of Classification Search .................... 438/55, 438/63, 237, 328; 257/E21.512, E21.513
See application file for complete search history.

(56) References Cited

U.S. PATENT DOCUMENTS

| | | | | | |
|---|---|---|---|---|---|
| 5,394,011 | A | * | 2/1995 | Yamamoto et al. | 257/693 |
| 5,821,624 | A | * | 10/1998 | Pasch | 257/776 |
| 6,113,728 | A | * | 9/2000 | Tsukagoshi et al. | 156/264 |
| 6,406,990 | B1 | * | 6/2002 | Kawai | 438/612 |
| 6,756,610 | B2 | * | 6/2004 | Sakamoto et al. | 257/79 |
| 2001/0045626 | A1 | | 11/2001 | Hirose | |
| 2002/0070047 | A1 | | 6/2002 | Jiang et al. | |
| 2005/0003579 | A1 | * | 1/2005 | Moden | 438/108 |
| 2005/0093121 | A1 | | 5/2005 | Chen et al. | |
| 2007/0102692 | A1 | * | 5/2007 | Asahara et al. | 257/13 |

FOREIGN PATENT DOCUMENTS
DE 10139383 2/2003

* cited by examiner

*Primary Examiner* — Cheung Lee
(74) *Attorney, Agent, or Firm* — Schwegman Lundberg & Woessner, P.A.

(57) ABSTRACT

Some embodiments of a chip module comprise a substrate, a semiconductor chip on the substrate, and a first layer between the substrate and the semiconductor chip, the first layer having high reflectivity for electromagnetic waves. Methods of protecting a chip module from electromagnetic radiation by interposing a protective layer between the chip and the substrate are also disclosed.

9 Claims, 3 Drawing Sheets

CHIP MODULE HAVING A PROTECTION DEVICE

CLAIM OF PRIORITY

This application claims priority under 35 USC 119 from German Application No. 10 2005 061 553.8, filed Dec. 22, 2005, which application is incorporated herein by reference and made a part hereof.

1. Technical Field

The invention relates to secure transaction cards and methods for making them, more specifically to cards having an electronic chip embedded in the web of the card.

2. Background

Chip modules such as transaction cards with embedded electronic circuit chips are increasingly being used, for example, as telephone cards, identification cards or the like. The increased importance of such cards has created an increasing interest in attacking them to gain access to stored information in the chip to introduce faults in its operation or to allow theft of funds or other assets linked to the card or its owner. Current countermeasures for resisting such attacks are required to resist increasingly sophisticated attacks.

BRIEF DESCRIPTION OF THE DRAWINGS

The invention will be explained in more detail below with reference to the embodiments described in the figures, in which.

DETAILED DESCRIPTION

Features which are similar in the embodiments of FIGS. 1-3 are each labeled using the same reference symbols.

A chip module needs to be protected against attack by a thief who uses electromagnetic energy, such as light to defeat security measures intended to prevent unauthorized access to data stored in the chip and money or other property that may be accessed through use of the chip or data stored within the chip. In some embodiments, a built in protection device is used to protect the chip from unauthorized access.

The embodiments illustrated in FIGS. 1 to 3 are used as examples for the purpose of explaining the invention. However, the fundamental principle of the invention can also be applied to other embodiments having another arrangement of the first and second layers, for example.

Figure 1A:
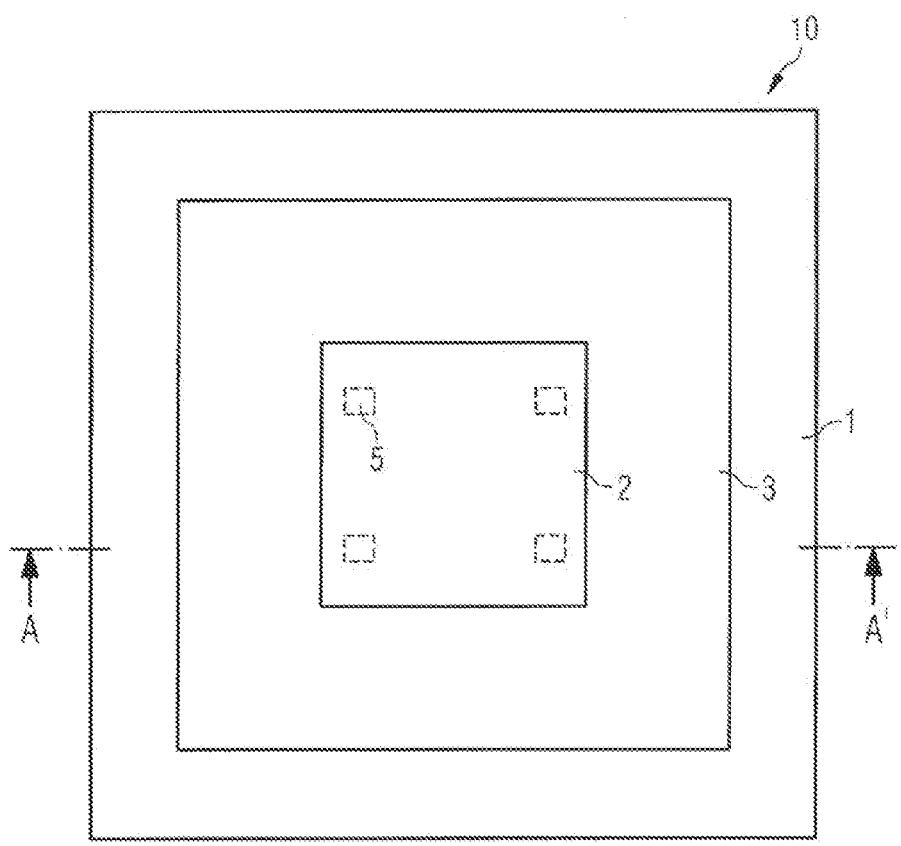
FIG. 1a shows a diagrammatic plan view and FIG. 1b is a diagrammatic cross-sectional view of some embodiments of a chip module.

FIG. 1a illustrates a plan view of a substrate 1 having a semiconductor chip 2 on it. Substrate 1, in some embodiments is a layer of a plastic card 10 such as a credit card or other transaction card. In some embodiments, the substrate 1 may be a PET (Polyethylene Terephtalate) carrier layer. The semiconductor chip 2 has smaller dimensions than the substrate 1.

In some embodiments, a highly reflective aluminum layer 3 is situated as a first layer over the entire area between the semiconductor chip 2 and the substrate 1. Aluminum layer 3 is interposed between chip 2 and substrate 1. In some embodiments, a further layer of material covers chip 2 and protective layer 3 of aluminum. In some embodiments, the further layer is formed of the same material as substrate 1. In some embodiments, substrate 1 and the further layer are plastic or PET materials. Protective layer 3, in some embodiments, is substantially electromagnetically opaque to radiation such as visible light. In some embodiments, it is highly reflective of electromagnetic energy striking its surface.

In some embodiments, the aluminum layer 3 covers a larger proportion of the area of the substrate 1 than the semiconductor chip 2 and therefore projects beyond the side edges of the semiconductor chip 2. In some other embodiments, the aluminum layer occupies only about the same proportion of the substrate area as the semiconductor chip 2.

Dashed lines are used in FIG. 1a to illustrate, four connecting elements 5, which are included in some embodiments, which are not visible from the top, between the semiconductor chip 2 and the highly reflective first layer 3. These connecting elements 5 are to provide an electrical connection between the semiconductor chip 2 and the highly reflective layer 3. Some embodiments provide for first layer to comprise an electrically conductive material such as aluminum and to establish an electrical connection between the semiconductor chip and a connection contact which is fitted or coupled to the substrate. This makes it possible for the semiconductor chip to be connected to an external data and/or power source via the connection contact.

In some embodiments the connecting elements 5 are also used as a mechanical connection. In some embodiments, it is also possible to entirely dispense with the connecting elements 5.

Figure 1B:
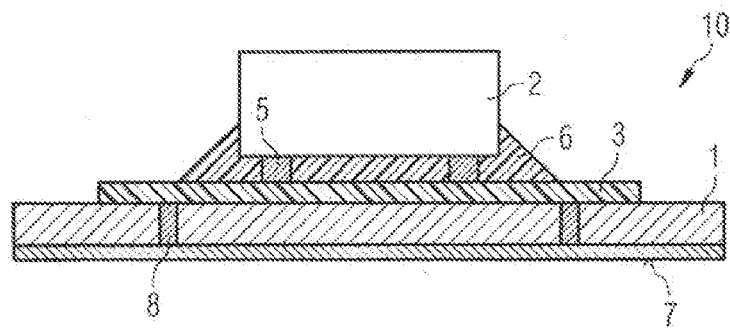

In order to more clearly explain the design of the embodiments of the chip module of FIG. 1a; FIG. 1b is a diagrammatic cross-sectional view along the line A-A' in FIG. 1a.

The semiconductor chip 2 is situated above the substrate 1, which in some embodiments may be a PET (Polyethylene Terephtalate) carrier layer. The highly reflective aluminum layer 3 is situated on the substrate 1 between the semiconductor chip 2 and the substrate 1. The semiconductor chip 2 is connected to the aluminum layer 3 both mechanically and, if necessary, electrically by suitably selecting the material of the connecting elements 5. The mechanical connection between the semiconductor chip and the aluminum layer 3 is also established, in some embodiments, by means of a filling material 6. In some embodiments, filling material 6 is an adhesive.

The filling material 6 is situated in the remaining gap between the semiconductor chip 2 and the aluminum layer 3. As is also illustrated in FIG. 1b, the filling material 6 also wets another part of the side walls of the semiconductor chip 2, which likewise contributes to mechanically fastening the semiconductor chip 2 to the aluminum layer 3.

As is also illustrated in FIG. 1b, contact areas 7, which are used to externally contact-connect the semiconductor chip 2, are fitted to a rear side of the substrate 1. The contact areas 7 are electrically connected to the aluminum layer 3 by means of contact holes 8 in the substrate 1. Contact holes 8, in some embodiments are filled with conductive material so that they become conductive vias 8.

In some embodiments, the semiconductor chip and a connection contact area 7 can be electrically connected by means of a wire connection from the top side of the semiconductor chip 2. In these embodiments, the connecting elements 5 do not need to have any electrical conductivity. In some such embodiments, it is also possible to entirely dispense with the connecting elements 5. The semiconductor chip 2 is then mechanically fastened to the highly reflective aluminum layer 3 by means of the filling material 6 which is situated over the entire area between the semiconductor chip 2 and the aluminum layer 3.

In the some embodiments of the invention, protection devices which are already present in the chip module, for example a sensor for electromagnetic waves, in particular a light sensor, are assisted by the layer having high reflectivity. This can take place in different ways.

To restrain an unauthorized person from visually inspecting the semiconductor chip, the first layer is used as a protective layer in order to make it difficult to visually access the semiconductor chip. In addition, in the event of an attack using electromagnetic radiation via the front side of the semiconductor chip, the radiation passing through the chip is reflected to the rear side of the chip at the first layer having high reflectivity. The effectiveness of the existing sensor is thus significantly improved because more radiation impinges on the sensor.

In the event of an attack using electromagnetic radiation on the rear side of the chip, that is to say from the side of the substrate 1, in which the first layer is only partially removed in order to irradiate the chip through the resulting hole, the remaining reflective layer 3 likewise reflects the radiation that is back-scattered from the semiconductor chip 2 to the sensor and thus again improves the effectiveness of the sensor as a result of an increased level of incident radiation reaching the sensor.

Figure 2A:
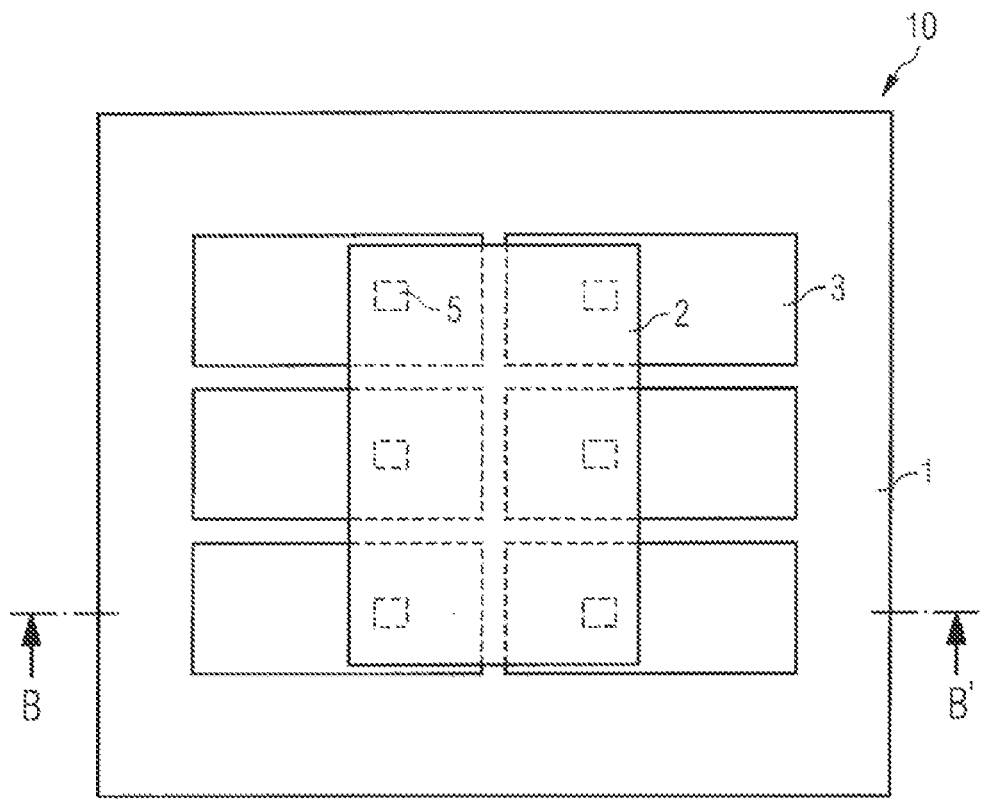
FIG. 2a is a diagrammatic plan view and FIG. 2b is a diagrammatic cross-sectional view of some embodiments of the chip module.
Figure 2B:
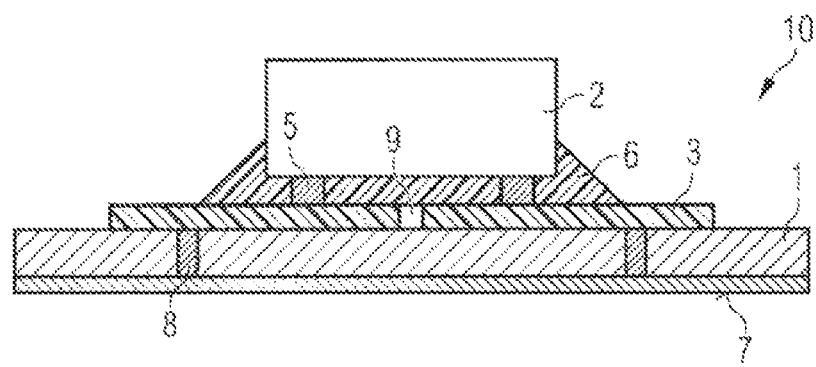

FIGS. 2a and 2b illustrate a second exemplary embodiment of the inventive chip module. In contrast to the first exemplary embodiment illustrated in FIGS. 1a and 1b, an aluminum layer 3 which has been divided into a plurality of subregions is situated between the semiconductor chip 2 and the substrate 1. The subregions are electrically insulated from one another by means of a narrow gap 9. The gap 9 can be filled with the filling material 6. Each subregion may represent an independent data and/or power line. A plurality of data and/or power lines to one or more external sources are thus possible, which allows a considerably higher level of efficiency of the semiconductor chip.

The plan view of the embodiments of the invention illustrated in FIG. 2a shows, for example, six subregions of the aluminum layer 3 which are spatially and electrically separated from one another only by means of a narrow gap. However, as a result, the highly reflective aluminum layer still occupies virtually the entire area between the semiconductor chip 2 and the substrate 1.

As also illustrated in FIG. 2a, a respective connecting element 5 connects each subregion of the aluminum layer 3 to the semiconductor chip 2. For the rest, the same features as were described for the embodiments of FIGS. 1a and 1b apply to the connecting elements 5.

In the cross-sectional view along the sectional line B-B' from FIG. 2a which is illustrated in FIG. 2b, a narrow gap 9 is shown between the subregions of the aluminum layer 3. Otherwise, the design of the embodiments illustrated in FIG. 2b corresponds to the design of the embodiments illustrated in FIG. 1b.

In a manner which is not illustrated, in some embodiments, each subregion may be electrically connected to a separate contact area 7 on the rear side of the substrate 1 by means of a respective contact via 8.

In some other embodiments, in a manner which is not illustrated, the electrical connection between the semiconductor chip 2 and each contact area 7 can be established using wire connections. In this case, the connecting element 5 does not need to be electrically conductive or it is possible to entirely dispense with a connecting element 5.

Figure 3A:
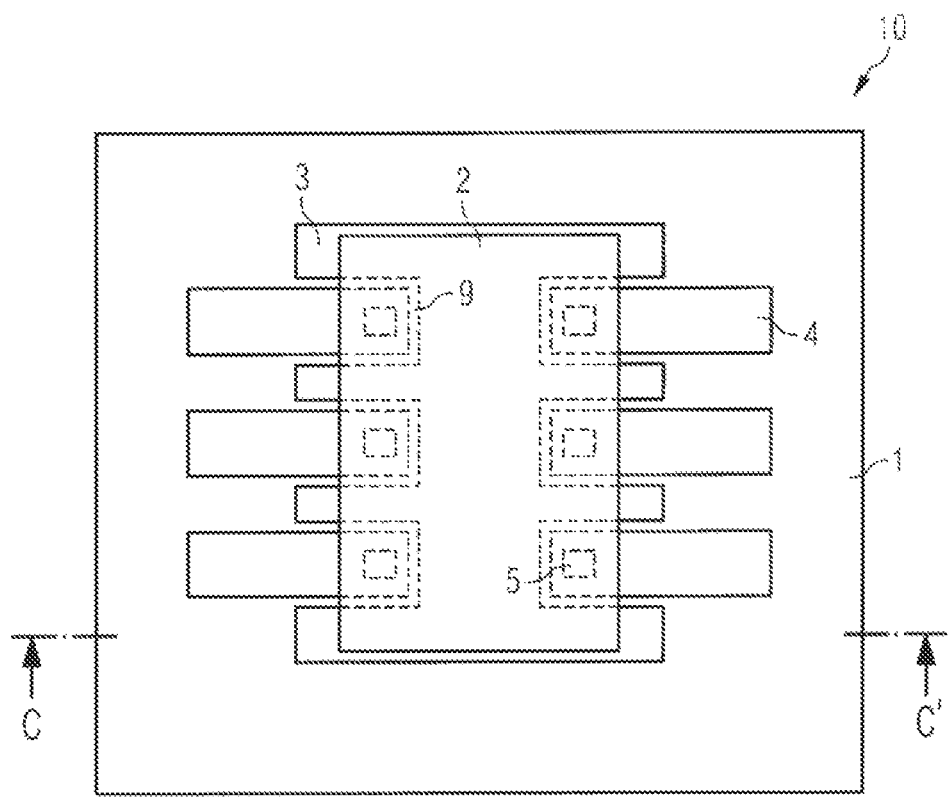
FIG. 3a is a diagrammatic plan view and FIG. 3b is a diagrammatic cross-sectional view of some embodiments of the chip module.
Figure 3B:
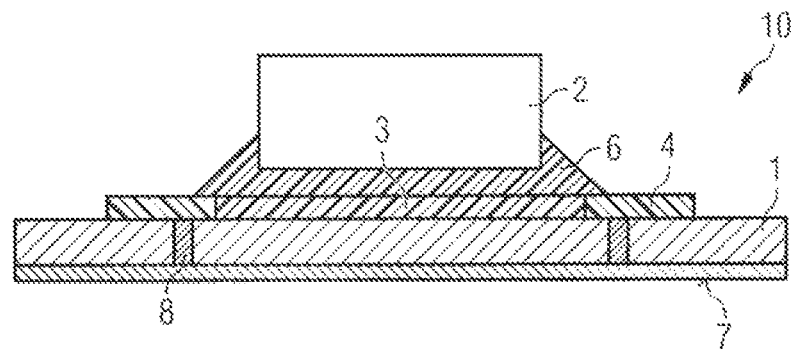

FIGS. 3a and 3b illustrate some embodiments of the inventive chip module. In contrast to the embodiments illustrated in FIGS. 1a and 1b and the embodiments illustrated in FIGS. 2a and 2b, two layers are situated between the semiconductor chip 2 and the substrate 1 as shown in FIGS. 3a and 3b. In these embodiments, a first layer corresponds to a highly reflective aluminum layer 3, while a second layer is used to electrically connect to a connection contact on the semiconductor chip 2. The second layer 3 is advantageous in some embodiments for connecting the chip to external data and/or power sources via the connection contacts. Materials which are especially suitable for this purpose, for example copper, can thus be used for the second layer.

FIG. 3a illustrates some embodiments of the invention. The area between the semiconductor chip 2 and the substrate 1 is occupied by a highly reflective aluminum layer 3, a second layer 4 and a narrow gap 9 remains between the aluminum layer 3 and the second layer 4. The second layer 4 is divided into a plurality of subregions which, in some embodiments, are as small as possible. Each subregion of the second layer 4 is connected to the semiconductor chip 2 by means of a connecting element 5. The connection is primarily used as an electrical connection between the semiconductor chip 2 and, in these embodiments of the invention, six exemplary contact areas 7. The connecting elements 5 are electrically conductive. In some embodiments first and second layers 3 and 4 are electrically insulated from each other. This avoids short circuits between a plurality of separate electrical connections of the semiconductor chip.

In some embodiments, the second layer is arranged beside the first layer. The thickness of the chip module is thus not affected.

In some other embodiments, an electrical connection between the semiconductor chip 2 and the contact areas 7 can also be established using wire connections, as also already described in relation to the embodiments of FIGS. 1a and 1b and 2a and 2b. The aluminum layer 3 occupies the larger proportion of area between the semiconductor chip 2 and the substrate 1. The aluminum layer 3 is in one part and is spatially and electrically separated from the second layer 4 by means of a narrow gap 9. In some embodiments the first layer 3 occupies virtually the entire remaining area beside the second layer 4 between the semiconductor chip 2 and the substrate 1. This results in the protective measure of the additional reflection of induced electromagnetic radiation acting, as far as possible, on a large region of the semiconductor chip 2.

Both the aluminum layer and subregions of the second layer 4 are guided out via the lateral delimitation of the semiconductor chip 2 on the substrate 1.

FIG. 3b illustrates an exemplary cross-sectional view along the sectional line C-C' from FIG. 3a. The design of the embodiments shown in FIG. 3b essentially corresponds to the design of the embodiments illustrated in FIG. 2b and of the embodiments illustrated in FIG. 1b. The fundamental difference between the abovementioned embodiments of the invention and the one in FIG. 3a is that a second layer 4 is also situated beside the aluminum layer 3 between the semiconductor chip 2 and the substrate 1.

Another embodiment provides for the chip module to have at least one further device for protecting against electromagnetic radiation. Screens, special housings or fault detection systems, for example, are suitable for this purpose. It is thus made additionally difficult to manipulate the chip. One advantageous refinement of some embodiments of the inventive chip module is if the chip module also comprises sensors for detecting electromagnetic radiation. As a result, the actual advantage of the highly reflective layer, namely that of making an additional contribution to the effectiveness of the sensors, really comes in useful for the first time. Light sensors, for example, are suitable as sensors.

In some embodiments, the first layer comprises metal. Metal is extremely suitable as a reflector of electromagnetic radiation, in particular light. The use of aluminum, which is vapor-deposited onto the substrate, is particularly suitable for this purpose. However, other metals, for example silver or other silver-shiny metals, are also suitable.

In some embodiments, the first layer is coated with a protective layer. A plastic is particularly suitable as the material for this protective layer. The protective layer protects the first layer from harmful environmental influences and is additionally also used to optically protect the semiconductor chip.

All of the three abovementioned embodiments of the invention are only intended to represent embodiments of the invention. In some of those embodiments, a highly reflective layer is introduced between a semiconductor chip and a carrier substrate over the greatest possible area in order, as far as possible, to render it impossible to carry out a fault-inducing attack on the semiconductor chip with the aid of electromagnetic radiation, in particular light, by improving the effectiveness of radiation sensors in the chip module, by reflecting the introduced radiation at the highly reflective layer, on the basis of the higher level of radiation intensity achieved thereby and thus being able to introduce measures to counter the attack using the sensor's reaction.

The invention claimed is:

1. A chip module, comprising
a substrate of insulator,
a semiconductor chip supported by the substrate and having a sensor for sensing electromagnetic radiation,
a first layer of metal between the substrate and the semiconductor chip, the first layer having a high reflectivity for electromagnetic radiation and positioned to increase a portion of the electromagnetic radiation to reach the sensor; and at least one second layer between the substrate and the semiconductor chip, and the second layer comprises an electrically conductive material electrically coupled between the semiconductor chip and a connection contact on the substrate.

2. The chip module of claim 1, wherein the second layer is electrically insulated from the first layer.

3. The chip module of claim 1, wherein the second layer is arranged beside the first layer.

4. The chip module of claim 3, the first layer occupying virtually the entire remaining area beside the second layer between the semiconductor chip and the substrate.

5. A chip module comprising
a substrate of insulator,
a semiconductor chip supported by the substrate, the chip having edges and having a sensor for sensing electromagnetic radiation;
a first layer of metal positioned between the substrate and the semiconductor chip, extending beyond the edges of the chip such that the chip is protected from attack by electromagnetic radiation and a portion of the electromagnetic radiation to reach the sensor is increased; and
a contact hole through the substrate, the contact hole being filled with conductive material to provide electrical contact to the first layer through the substrate.

6. The chip module of claim 5 and further comprising a contact supported on the substrate opposite the first layer and electrically coupled to the conductive material in the contact hole.

7. The chip module of claim 5 and further comprising an insulating adhesive layer between the chip and the first layer of metal.

8. The chip module of claim 7 and further comprising a connector between the chip and the first layer of metal through the adhesive layer.

9. The chip module of claim 8 wherein the connector between the chip and the first layer of metal provides mechanical retention and electrical connection.

* * * * *